United States Patent
Shin et al.

(10) Patent No.: US 10,141,255 B2
(45) Date of Patent: Nov. 27, 2018

(54) CIRCUIT BOARDS AND SEMICONDUCTOR PACKAGES INCLUDING THE SAME

(71) Applicant: Samsung Electronics Co., Ltd., Suwon-si (KR)

(72) Inventors: MuSeob Shin, Cheonan-si (KR); Won-young Kim, Yongin-si (KR); Sanghyun Park, Seoul (KR); Jinchan Ahn, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/994,004

(22) Filed: May 31, 2018

(65) Prior Publication Data

US 2018/0277474 A1    Sep. 27, 2018

Related U.S. Application Data

(63) Continuation of application No. 15/089,604, filed on Apr. 4, 2016, now Pat. No. 10,002,822.

(30) Foreign Application Priority Data

Jun. 24, 2015    (KR) ........................ 10-2015-0089891

(51) Int. Cl.
*H01L 23/498*    (2006.01)
*H01L 23/48*    (2006.01)
(Continued)

(52) U.S. Cl.
CPC ...... *H01L 23/49838* (2013.01); *H01L 23/481* (2013.01); *H01L 23/49816* (2013.01); *H01L 23/49827* (2013.01); *H01L 23/562* (2013.01); *H01L 23/3128* (2013.01); *H01L 24/13* (2013.01); *H01L 24/16* (2013.01);
(Continued)

(58) Field of Classification Search
CPC ......... H01L 23/49838; H01L 23/49816; H01L 23/49827; H01L 23/562; H01L 23/481; H01L 23/3128; H01L 24/17
See application file for complete search history.

(56) References Cited

U.S. PATENT DOCUMENTS 5,352,926 A    10/1994    Andrews
6,657,296 B2    12/2003    Ho et al.
(Continued)

FOREIGN PATENT DOCUMENTS

JP    2001-168503 A    6/2001
JP    2002-343818 A    11/2002
(Continued)

*Primary Examiner* — Peniel M Gumedzoe
(74) *Attorney, Agent, or Firm* — Muir Patent Law, PLLC

(57) ABSTRACT

A circuit board and a semiconductor packages therewith are disclosed. The circuit board may include a top surface, on which at least one semiconductor chip is mounted, and a bottom surface, to which at least one outer terminal is coupled. The top surface may include an upper window region, on which an upper conductive pattern electrically connected to the semiconductor chip is provided, and the bottom surface may include a lower window region, on which a lower conductive pattern electrically connected to the upper conductive pattern is provided. Here, a ratio of an area of the lower conductive pattern to an area of the upper conductive pattern may be less than or equal to 1.5.

20 Claims, 19 Drawing Sheets

(51) Int. Cl.
*H01L 23/00* (2006.01)
*H01L 25/065* (2006.01)
*H01L 23/31* (2006.01)

(52) U.S. Cl.
CPC .............. *H01L 24/32* (2013.01); *H01L 24/73* (2013.01); *H01L 24/81* (2013.01); *H01L 24/92* (2013.01); *H01L 25/0655* (2013.01); *H01L 25/0657* (2013.01); *H01L 2224/131* (2013.01); *H01L 2224/13025* (2013.01); *H01L 2224/13147* (2013.01); *H01L 2224/16145* (2013.01); *H01L 2224/16227* (2013.01); *H01L 2224/32225* (2013.01); *H01L 2224/73204* (2013.01); *H01L 2224/81192* (2013.01); *H01L 2224/81815* (2013.01); *H01L 2224/92125* (2013.01); *H01L 2225/06513* (2013.01); *H01L 2225/06517* (2013.01); *H01L 2225/06541* (2013.01); *H01L 2924/15311* (2013.01); *H01L 2924/3511* (2013.01)

(56) References Cited

U.S. PATENT DOCUMENTS

| | | | |
|---|---|---|---|
| 7,139,678 | B2 | 11/2006 | Kobayashi et al. |
| 7,190,056 | B2 | 3/2007 | Nurminen |
| 7,253,503 | B1 | 8/2007 | Fusaro et al. |
| 7,825,498 | B2 | 11/2010 | Haga et al. |
| 8,927,334 | B2 | 1/2015 | Daubenspeck et al. |
| 9,105,535 | B2 | 8/2015 | Blackshear et al. |
| 2002/0132450 | A1 | 9/2002 | Nose |
| 2005/0258452 | A1 | 11/2005 | Konishi et al. |
| 2014/0291005 | A1 | 10/2014 | Fukushima et al. |
| 2014/0311771 | A1 | 10/2014 | Shimizu et al. |

FOREIGN PATENT DOCUMENTS

| | | |
|---|---|---|
| JP | 2007-328498 A | 12/2007 |
| JP | 2013-172138 A | 2/2013 |
| JP | 5539800 B2 | 7/2014 |
| JP | 5761671 B2 | 8/2015 |
| KR | 10-2001-0019763 A | 3/2001 |

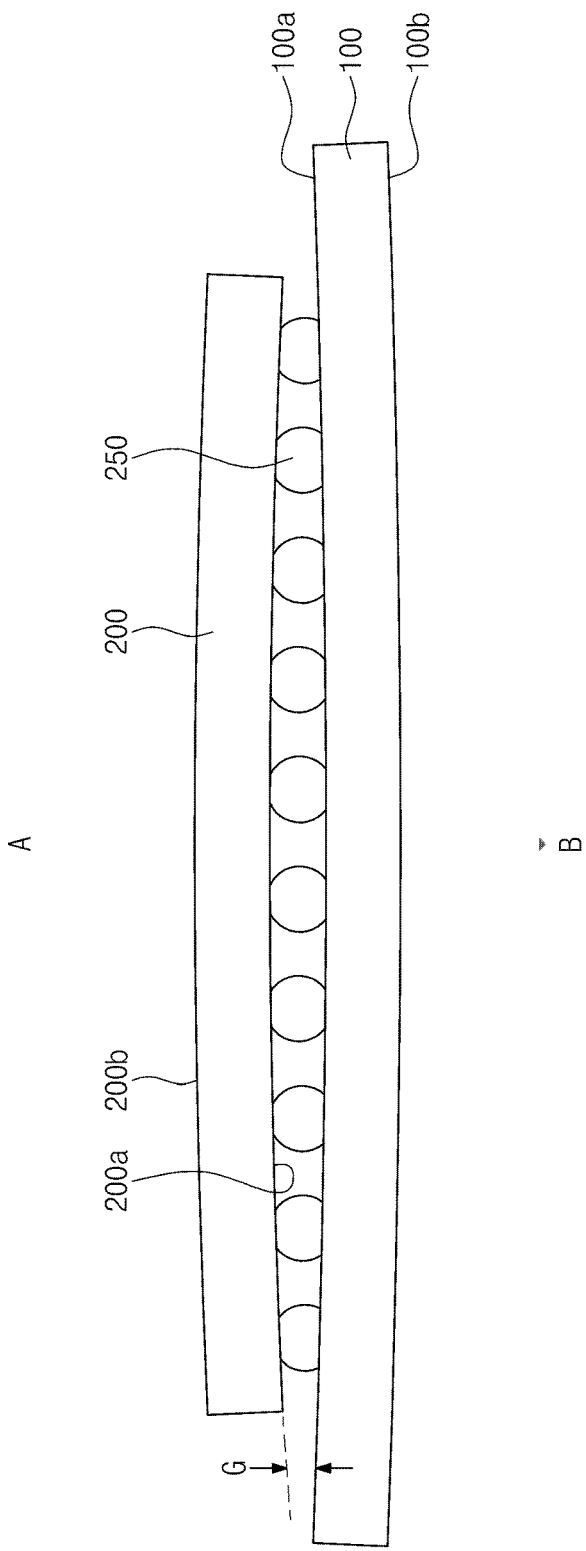

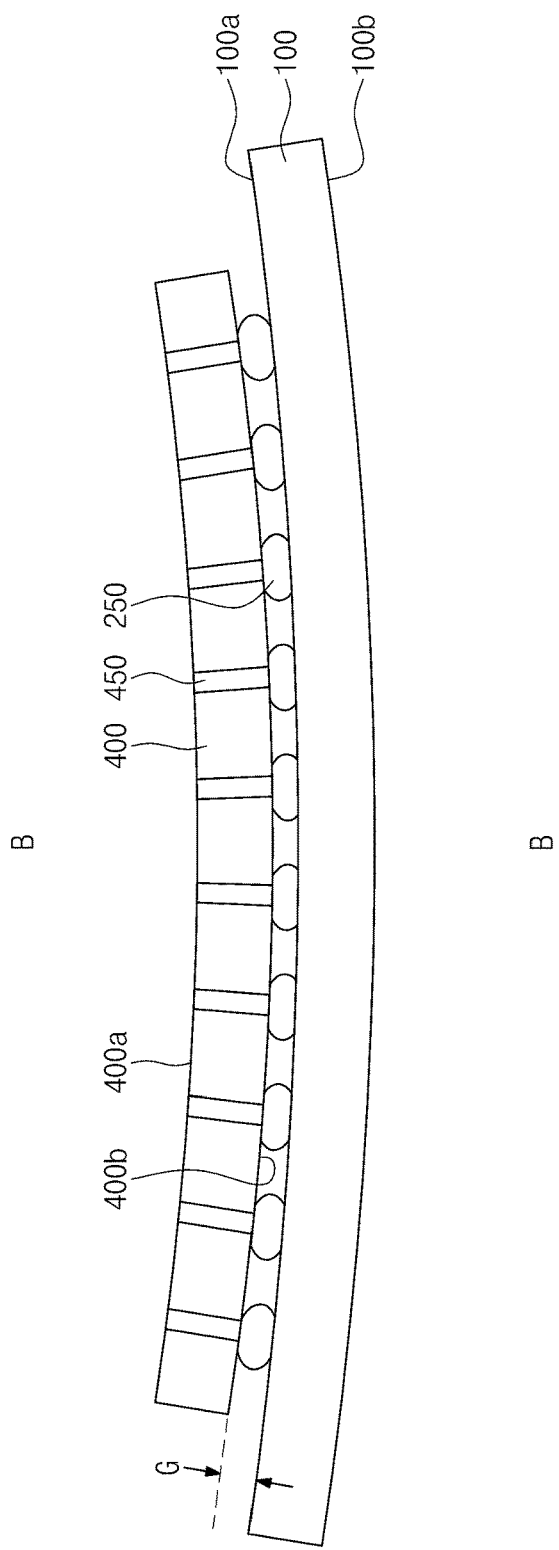

CIRCUIT BOARDS AND SEMICONDUCTOR PACKAGES INCLUDING THE SAME

CROSS-REFERENCE TO RELATED APPLICATIONS

This application claims priority to and is a continuation of U.S. patent application Ser. No. 15/089,604 filed on Apr. 4, 2016, which claims priority under 35 U.S.C. § 119 to Korean Patent Application No. 10-2015-0089891, filed on Jun. 24, 2015, in the Korean Intellectual Property Office, the entire contents of each of which are hereby incorporated by reference.

BACKGROUND OF THE INVENTION

The present disclosure relates to a semiconductor package, and in particular, to circuit boards and semiconductor packages including the same.

In general, a process of fabricating a semiconductor package may include mounting a semiconductor chip on a circuit board (e.g., PCB) and encapsulating the resulting structure with a mold layer. When a flip-chip bonding technique is used to fabricate the semiconductor package, a soldering process may be performed to form solder balls or solder bumps between the circuit board and the semiconductor chip. However, the semiconductor chip and the circuit board may be bent by heat energy applied in the soldering process. In the case that a warpage direction of the semiconductor chip is different from that of the circuit board, it may be difficult to properly form electric connection paths between the semiconductor chip and the circuit board.

SUMMARY

Example embodiments of the inventive concept provide a circuit board, allowing for a semiconductor chip to be properly connected thereto, and a semiconductor package including the circuit board.

Example embodiments of the inventive concept provide a circuit board configured to suppress a semiconductor package from being bent and a semiconductor package including the circuit board.

Example embodiments of the inventive concept provide a circuit board, which is configured to be bent in relation to a warpage direction of a semiconductor chip, and a semiconductor package including the circuit board.

In some aspects of the inventive concept, a circuit board and a semiconductor package therewith may be configured in such a way that a ratio in area between certain conductive patterns provided on top and bottom surfaces of circuit board has an optimized value, and this makes it possible to suppress warpage of the circuit board from occurring.

In some aspects of the inventive concept, since the circuit board and the semiconductor package therewith are configured to suppress the warpage of the circuit board from occurring, it is possible to form good electric connection between the semiconductor chip and the circuit board.

In some aspects of the inventive concept, the circuit board and the semiconductor package therewith may be configured to reduce a difference in warpage direction between the circuit board and the semiconductor chip.

According to example embodiments of the inventive concept, a circuit board may include a top surface, on which at least a first semiconductor chip is mounted, and a bottom surface, to which outer terminals are coupled. The top surface may include an upper window region, in which a plurality of bonding pads are provided, the plurality of bonding pads electrically connected to the first semiconductor chip, and the bottom surface may include a lower window region, on which a lower electric pattern electrically connected to at least a first bonding pad of the plurality of bonding pads. The lower window region may have the same size as the upper window region. The lower electric pattern may not include or contact any pads, ball lands, or external terminals of the circuit board. A ratio of an area occupied by the lower conductive pattern to an area occupied by the bonding pads of the plurality of bonding pads may be less than or equal to 1.5. The electric pattern may be a mesh pattern including a plurality of first conductive lines extending in a first direction, and a plurality of second conductive lines extending in a second direction different from the first direction.

In some embodiments, the lower conductive pattern may include a power or ground pattern electrically connected to at least one of the bonding pads and electrically connected to one or more circuit elements of the first semiconductor chip for receiving power or ground signals.

In some embodiments, the upper window region may occupy only a portion of the top surface, and the lower window region may occupy only a portion of the bottom surface.

In some embodiments, the portion of the bottom surface occupied by the lower window region may overlap the portion of the top surface occupied by the upper window region. The upper window region may be defined as the region corresponding to the outer boundaries of the shape formed by the plurality of bonding pads. The lower window region is defined as the region corresponding to the outer boundaries of the shape formed by the lower electric pattern.

In some embodiments, the bottom surface may further include at least one ball land region, on which ball lands connected with the outer terminals are arranged, and at least one of the ball lands may be electrically connected to the lower electric pattern.

In some embodiments, the bottom surface may further include two ball land regions, on which ball lands connected with the outer terminals are arranged, and which are provided at opposite edges of the bottom surface, and the lower window region may be provided at a center region of the bottom surface between the two ball land regions.

In some embodiments, the upper window region may be provided at a center region of the top surface overlapping the center region of the bottom surface.

According to example embodiments of the inventive concept, a semiconductor package may include a circuit board with top and bottom surfaces opposite each other, a semiconductor chip mounted on the top surface of the circuit board, and a plurality of connection terminals electrically connecting the circuit board to the semiconductor chip. The circuit board may include an upper window region, on which a plurality of bonding pads electrically connected to the semiconductor chip are provided, the upper window region occupying at least a portion of the top surface of the circuit board, and a lower window region, on which a lower electric pattern electrically connected to at least a first bonding pad of the plurality of bonding pads is provided, the lower window region occupying at least a portion of the bottom surface of the circuit board. The lower electric pattern may have a ladder or mesh structure. An area ratio of the lower conductive pattern to the upper conductive pattern may be less than or equal to 1.5.

In some embodiments, the bonding pads may be provided at a center region of the top surface of the circuit board, and the electric pattern may be provided at a center region of the bottom surface of the circuit board.

In some embodiments, the circuit board may further include two ball land regions provided at opposite edges of the bottom surface and spaced apart from each other with the lower window region interposed therebetween, and each of the ball land regions may include a plurality of ball lands connected with outer terminals.

In some embodiments, the electric pattern may include a power or ground pattern electrically connected to at least one of the ball lands provided on at least one of the ball land regions.

In some embodiments, the upper window region may overlap the lower window region.

In some embodiments, the semiconductor chip may include a first surface facing the top surface of the circuit board and a second surface opposite to the first surface, and the connection terminals may be provided between the first surface of the semiconductor chip and the top surface of the circuit board.

In some embodiments, the connection terminals may be provided at positions overlapping the upper window region.

In some embodiments, the area ratio ranges from 0.5 to 1.5 or from 1 to 1.4.

In some embodiments, the semiconductor chip may be bent in a direction away from the top surface of the circuit board.

In some embodiments, the circuit board may be bent in a direction opposite to that of the semiconductor chip.

In some embodiments, the circuit board and the semiconductor chip may be provided to define a gap therebetween, the gap having different lengths at different portions of the stacked semiconductor chip and circuit board, wherein the gap length increases in a direction from an edge region of the circuit board toward a center region of the circuit board.

In some embodiments, the circuit board may be bent in the same direction as that of the semiconductor chip.

In some embodiments, the circuit board and the semiconductor chip may be provided to define a gap, whose thickness may be substantially uniform in a direction parallel to the top surface of the circuit board.

In some embodiments, the semiconductor package may further include a mold layer provided on the top surface of the circuit board to encapsulate the semiconductor chip.

According to example embodiments of the inventive concept, a semiconductor package may include a circuit board including a top surface, on which bonding pads are provided, and a bottom surface, on which a conductive pattern electrically connected to at least one of the bonding pads are provided, a semiconductor chip mounted on the top surface of the circuit board, and connection terminals coupled to the bonding pads to electrically connect the semiconductor chip to the circuit board. An area ratio of the conductive pattern to the bonding pads may be less than or equal to 1.5.

In some embodiments, the circuit board may include an upper window region occupying at least a portion of the top surface, and the bonding pads may be provided in the upper window region.

In some embodiments, the circuit board may further include a lower window region occupying at least a portion of the bottom surface, and the conductive pattern may be provided in the lower window region.

In some embodiments, the semiconductor chip and the circuit board may be bent in different directions.

In some embodiments, the semiconductor chip may be bent in a direction away from the circuit board, and the circuit board may be bent in a direction away from the semiconductor chip.

In some embodiments, the semiconductor chip and the circuit board may be provided to include a gap, whose value decreases in a direction toward an edge region of the circuit board and increases in a direction toward a center region of the circuit board.

In some embodiments, the semiconductor chip and the circuit board may be bent in the same direction.

In some embodiments, the semiconductor chip may be bent in a direction away from the circuit board, and the circuit board may be bent in a direction toward the semiconductor chip.

In some embodiments, the semiconductor chip and the circuit board may be provided to include a gap, whose thickness is substantially uniform in a direction parallel to the top surface of the circuit board.

According to example embodiments of the inventive concept, a semiconductor package may include a circuit board with top and bottom surfaces facing each other, a semiconductor chip mounted on the top surface of the circuit board, and a plurality of connection terminals electrically connecting the circuit board to the semiconductor chip. The circuit board may include an upper window region, on which an upper conductive pattern electrically connected to the semiconductor chip is provided, and the upper window region occupying a center region of the top surface of the circuit board, a lower window region overlapped with the upper window region to occupy a center region of the bottom surface of the circuit board, and ball land regions, on which ball lands electrically connected with outer terminals are provided, the ball land regions occupying a remaining region of the bottom surface, other than the center region. The lower window region may be a conductive-pattern-free region.

In some embodiments, the ball land regions may be spaced apart from each other with the lower window region interposed therebetween.

In some embodiments, an area of the top surface of the circuit board occupied by the upper window region may be substantially equal to an area of the bottom surface of the circuit board occupied by the lower window region.

In some embodiments, the upper window region may have substantially the same shape as the lower window region.

In some embodiments, a semiconductor package includes a package substrate with top and bottom surfaces opposite each other, a semiconductor chip mounted on the top surface of the package substrate, and a plurality of connection terminals electrically connecting the package substrate to the semiconductor chip. The package substrate may include an upper window region, in which a plurality of bonding pads electrically connected to the semiconductor chip are provided, the upper window region occupying a portion of the top surface of the package substrate and including all of the bonding pads at the top surface of the package substrate that connect to the semiconductor chip. The upper window region may cover an area defined by outer boundaries of a shape formed by the plurality of bonding pads. The package substrate may additionally include a lower window region, in which a lower electric pattern electrically connected to at least a first bonding pad of the plurality of bonding pads is provided. The lower electric pattern may be at a first vertical level at a bottom surface of the package substrate and may be disposed to not contact any pads, ball lands, or external terminals of the package substrate. The lower window region may cover an area defined by outermost boundaries of a shape formed by the lower electric pattern at the first vertical level, and an area ratio of the lower electric pattern to the plurality of bonding pads may be less than or equal to 1.5. In some embodiments, the lower electric pattern has a mesh or ladder-shaped configuration.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A through 4C are sectional views illustrating examples of a warpage phenomenon, which may occur in a semiconductor package according to example embodiments of the inventive concept.

FIG. 5C is a sectional view illustrating a modified example of FIG. 5A according to example embodiments.

Figure 1:
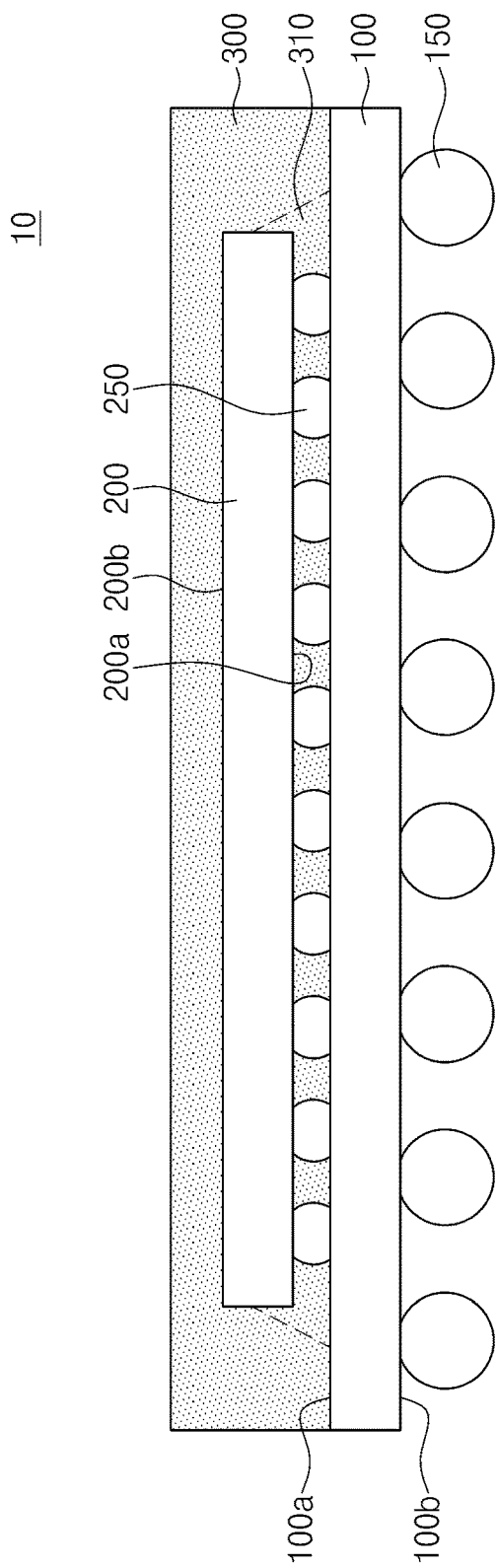
FIG. 1 is a sectional view illustrating a semiconductor package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Though the different drawings show variations of exemplary embodiments, these drawings are not necessarily intended to be mutually exclusive from each other. Rather, as will be seen from the context of the detailed description below, certain features depicted and described in different drawings can be combined with other features from other drawings to result in various embodiments, when taking the drawings and their description as a whole into consideration.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below in one section of the specification could be termed a second element, component, region, layer or section in another section of the specification or in the claims without departing from the teachings of the present embodiments. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Items may be directly electrically connected, but not directly physically connected (e.g., for a conductive pad on one substrate connected to a conductive pad on another substrate only through a wire, the two pads are directly electrically connected but not directly physically connected).

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
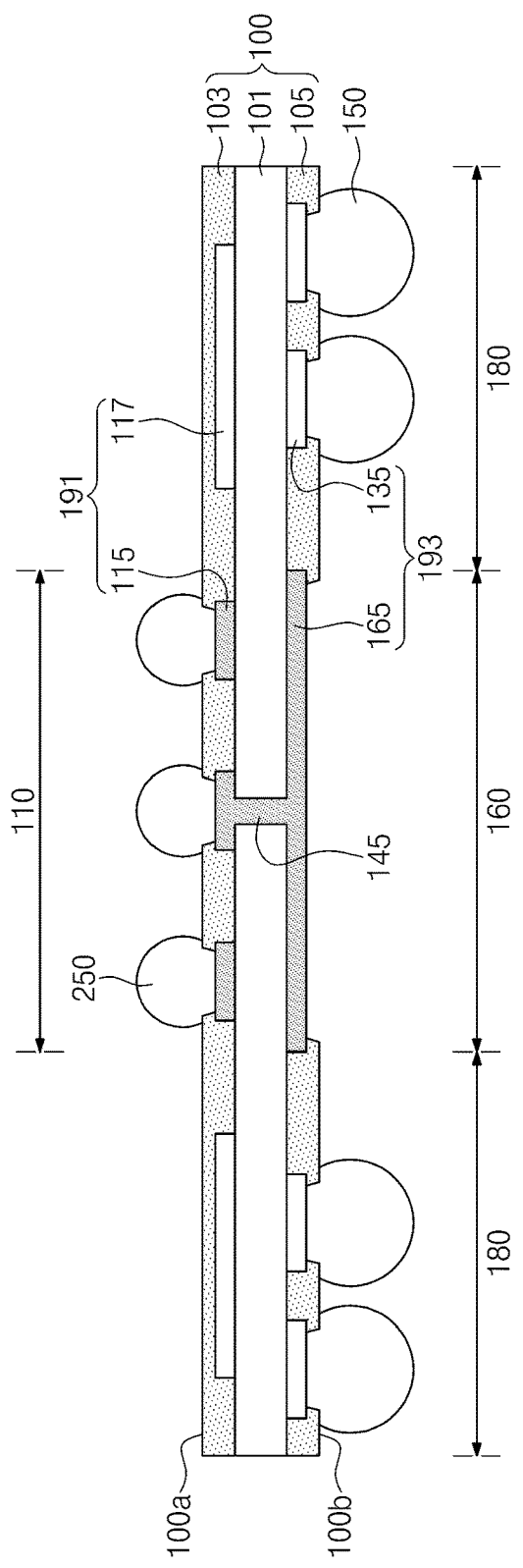
FIG. 2A is a sectional view illustrating a package substrate according to example embodiments of the inventive concept.
Figure 2B:
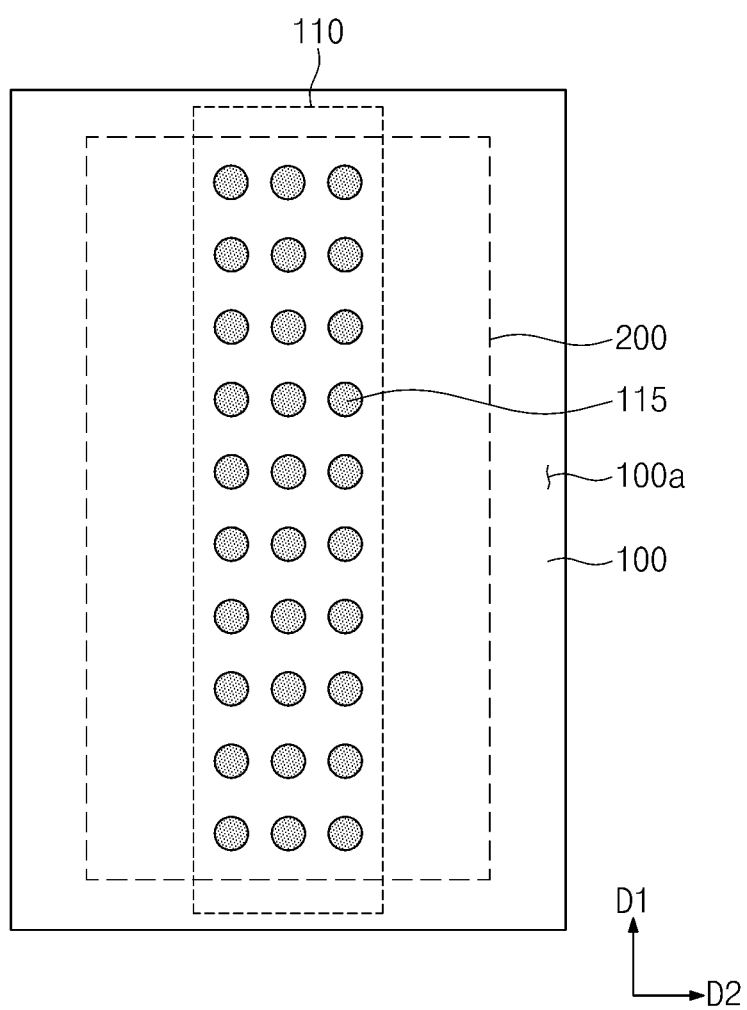
FIG. 2B is a plan view illustrating a top surface of a package substrate of FIG. 2A according to example embodiments.
Figure 2C:
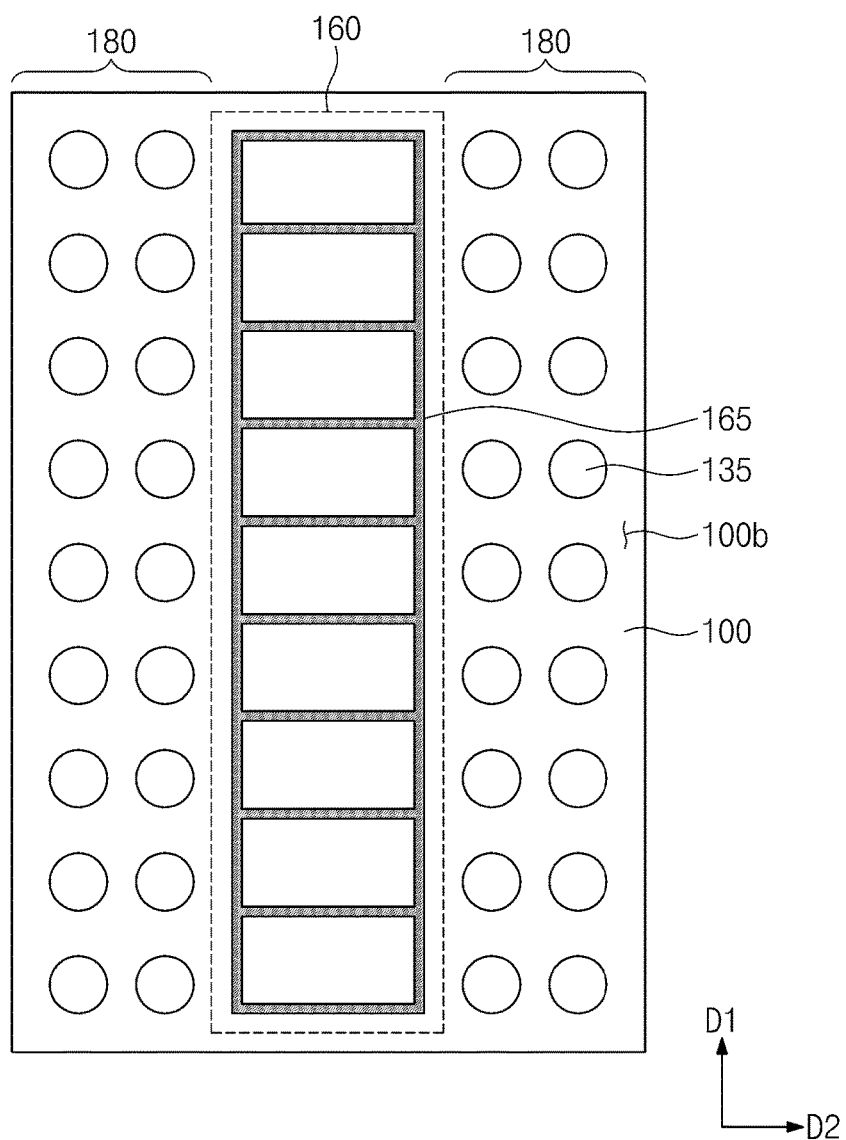
FIG. 2C is a plan view illustrating a bottom surface of a package substrate of FIG. 2A according to example embodiments.
Figure 2D:
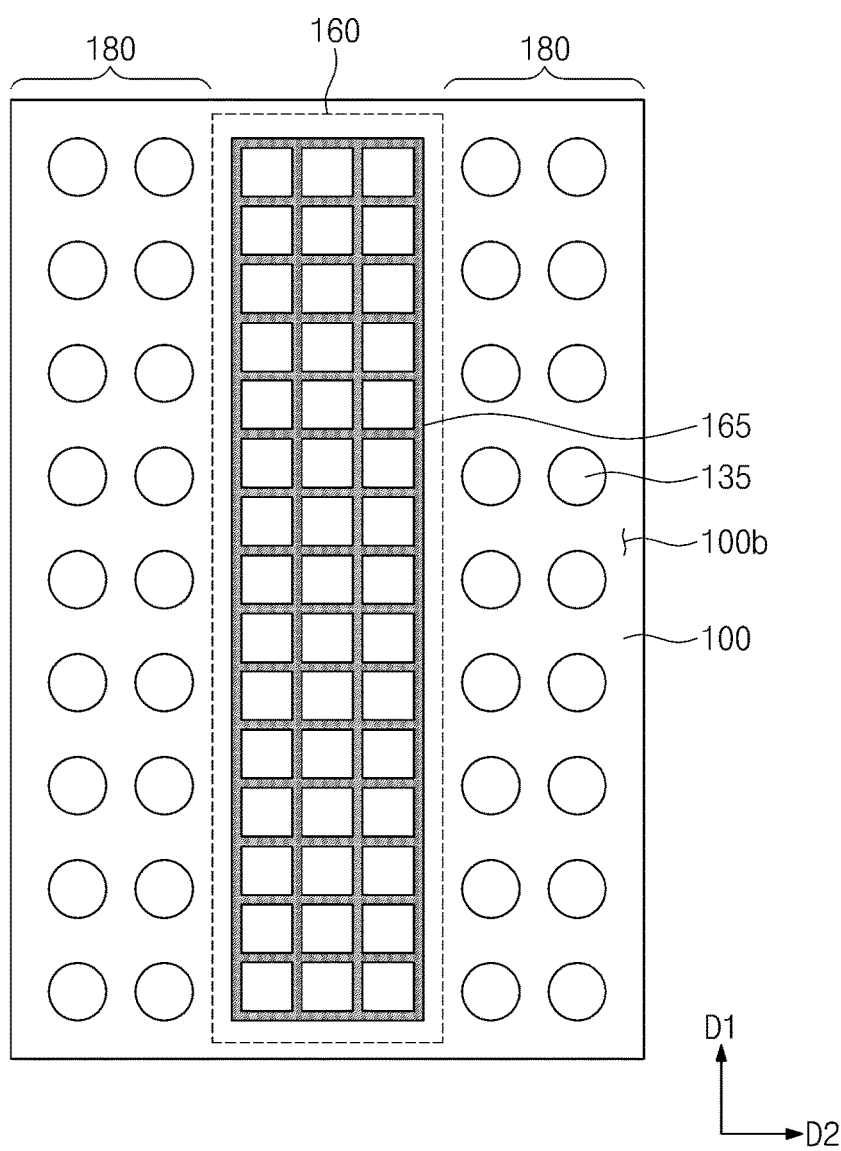
FIG. 2D is a plan view illustrating a modified example of FIG. 2C according to example embodiments.
Figure 2E:
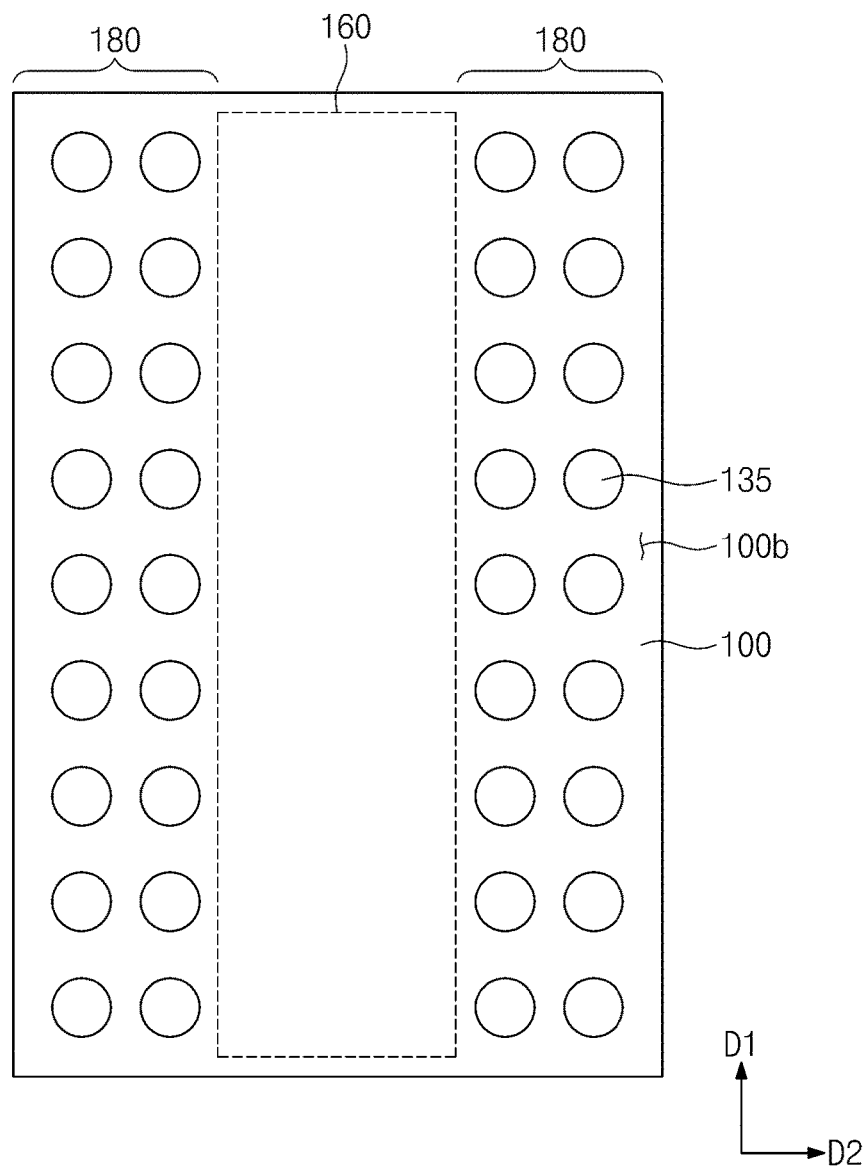
FIG. 2E is a plan view illustrating another modified example of FIG. 2C according to example embodiments.

FIG. 1 is a sectional view illustrating a semiconductor package according to example embodiments of the inventive concept. FIG. 2A is a sectional view illustrating a package substrate according to example embodiments of the inventive concept. FIGS. 2B and 2C are plan views respectively illustrating top and bottom surfaces of the package substrate of FIG. 2A. FIGS. 2D and 2E are plan views illustrating modified examples of FIG. 2C. FIGS. 3A through 3E are plan views illustrating modified examples of FIG. 2B.

The term "semiconductor device" be used herein to generally refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Thus, certain of the devices described herein may be generally referred to as a semiconductor device.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 1, a semiconductor package 10 may include a semiconductor chip 200, a package substrate 100 on which the semiconductor chip 200 is mounted, and a mold layer 300 which is provided to cover or encapsulate the semiconductor chip 200. The semiconductor chip 200 may be a memory chip, a non-memory chip, or any combination thereof. For example, the semiconductor chip 200 may be formed by an integrated circuit formed on a die, for example, from a wafer. In some embodiments, the package substrate 100 may be a printed circuit board (PCB), the semiconductor chip 200 may be mounted on a top surface 100a of the package substrate 100, and a plurality of outer terminals 150 (e.g., solder balls) may be attached to a bottom surface 100b of the package substrate 100. An under-fill layer 310 may be further provided between the semiconductor chip 200 and the package substrate 100. Example embodiments of the inventive concept may not be limited to the example shown in FIG. 1, in which a single semiconductor chip 200 is illustrated. For example, the semiconductor package 10 may include a plurality of semiconductor chips 200, which are vertically stacked on the package substrate 100 or are arranged in a lateral direction. Also, the under-fill layer 310 may be either omitted, or may be formed of the same structure and in the same process as the mold layer, to form a single mold layer that covers a top and sides of the semiconductor chip 200 as well as spaces between the semiconductor chip 200 and the package substrate 100.

The semiconductor chip 200 may be electrically connected to the package substrate 100 through connection terminals 250. For example, the semiconductor chip 200 may be mounted on the top surface 100a of the package substrate 100 in such a way that a first surface 200a thereof is oriented in a downward direction facing the package substrate 100 and a second surface 200b thereof is oriented in an upward direction. The semiconductor chip 200 and the package substrate 100 may be electrically connected to each other through a plurality of connection terminals 250, which are provided between the first surface 200a of the semiconductor chip 200 and the top surface 100a of the package substrate 100. In some embodiments, the connection terminals 250 may be solder balls, solder bumps, or solder-containing metal bumps (e.g., copper pillar bumps). For example, the connection terminals 250 may be electrically connected to electrically conductive components of both the semiconductor chip 200 and the package substrate 100, for example, to connect integrated circuits of the semiconductor chip 200 to circuits and/or conductive lines of the package substrate.

The first surface 200a may be used as an active surface, on which integrated circuits are integrated, and the second surface 200b may be used as an inactive surface. In some embodiments, the first surface 200a may be used as the inactive surface, and the second surface 200b may be used as the active surface. In the case where the first surface 200a is used as the inactive surface, the semiconductor chip 200 may further include through electrodes 450 (e.g., through-substrate vias such as through-silicon vias) electrically connected to the connection terminals 250, as will be described with reference to FIG. 4C.

As shown in FIG. 2B, the top surface 100a of the package substrate 100 may include an upper window region 110 on which bonding pads 115 are disposed. The bonding pads 115 may be electrically connected to the connection terminals 250. The bonding pads 115 may be directly electrically connected to the connection terminals 250, and may also contact the connection terminals 250. The bonding pads 115 may connect to an internal circuit or wiring of the package substrate 100. As shown in FIG. 2C, the bottom surface 100b of the package substrate 100 may include a plurality of separated ball land regions 180 on which ball lands 135 are disposed, and a lower window region 160 positioned between the ball land regions 180. The ball lands 135 may be electrically connected to the outer terminals 150. In some descriptions, the term "connection terminal" may be used to refer to any of terminals 150 or 250. The term "conductive terminal" may be used to refer to these terminals or connector such as a bonding pad or ball land. Terminals 150 may be more specifically referred to as internal package terminals or internal package interconnection terminals. Terminals 150 may connect items of the package substrate 100 to items of the semiconductor chip 200 and thus may be internal package interconnection terminals. Terminals 250 may be more specifically referred to as external package terminals. Terminals 250 may connect the semiconductor package 10 to another device, such as a module board or other board, for example. Items described as pads or ball lands herein may have substantially flat surfaces, while items described as balls or bumps herein may have curved surfaces.

In the structure of the semiconductor package 10 shown in FIG. 1, an upper structure (e.g., positioned above the top surface 100a of the package substrate 100) may correspond to the upper window region 110 of FIG. 2B taken parallel to a first direction D1, and a lower structure (e.g., positioned below the bottom surface 100b of the package substrate 100) may correspond to one of the ball land regions 180 of FIG. 2C taken parallel to the first direction D1.

A structure of the package substrate 100 will be described in more detail with reference to FIGS. 2A through 2D. FIG. 2A is a sectional view of the package substrate 100 shown in FIG. 2B or FIG. 2C, which is taken along a second direction D2 crossing the first direction D1. In some embodiments, the first direction D1 may be perpendicular to the second direction D2.

Referring to FIGS. 1 and 2A, the package substrate 100 may include an upper conductive pattern 191, a lower conductive pattern 193, an upper solder resist layer 103, and a lower solder resist layer 105. In some embodiments, the upper conductive pattern 191 may include the bonding pads 115 and upper electric patterns 117 which are provided on a top surface of a core 101. Each of the bonding pads 115 and upper electric patterns 117 may be referred to as upper conductive sub-patterns (e.g., first upper conductive sub-pattern 115 and second upper conductive sub-pattern 117). The lower conductive pattern 193 may include the ball lands 135 and a lower electric pattern 165 which are provided on a bottom surface of the core 101. Each of the ball lands 135 and lower electric patterns 165 may be referred to as lower conductive sub-patterns (e.g., first lower conductive sub-pattern 135 and second lower conductive sub-pattern 165). In certain embodiments, the upper solder resist layer 103 may be provided to cover the top surface of the core 101 and expose the bonding pads 115. The lower solder resist layer 105 may be provided to cover the bottom surface of the core 101 and expose the ball lands 135. In certain embodiments, the upper solder resist layer 103 may be provided to cover or expose the upper electric patterns 117. The lower solder resist layer 105 may be provided to cover or expose the lower electric pattern 165. In certain embodiments, the core 101 may include, for example, an insulative material that supports the various layers and elements formed thereon. Also, in some cases, the core 101 may include a material that has a lower coefficient of thermal expansion than the material that forms the bonding pads 115 and/or the lower electric pattern 165.

The upper conductive pattern 191 may further include at least one of upper metal lines, which may be electrically connected to at least one of the bonding pads 115 and/or at least one of the upper electric patterns 117. The lower conductive pattern 193 may further include at least one of lower metal lines, which may be electrically connected to at least one of the ball lands 135 and/or at least one of the lower electric pattern 165. The upper and lower conductive patterns 191 and 193 may include the same or similar metallic material as each other (e.g., copper or aluminum), and this allows for the upper and lower conductive patterns 191 and 193 to have the same or similar thermal expansion coefficient. For example, the upper conductive patterns 191 may be formed of the same metal, alloy, or other conductive material as the lower conductive patterns 193. Or, the upper conductive patterns 191 may be formed of a different metal, alloy, or other conductive material as the lower conductive patterns 193, but may have a same or similar coefficient of thermal expansion (CTE) as the lower conductive patterns 193. In some embodiments, the upper conductive patterns 191 and lower conductive patterns 193 have the same or similar CTEs as each other, and both have higher CTEs than the material that forms the core 101. In some embodiments, a part (e.g., the bonding pads 115) of the upper conductive pattern 191 may have the same or similar thickness as a part (e.g., the lower electric pattern 165) of the lower conductive pattern 193. The upper and lower metal lines are not illustrated to reduce complexity in the drawings, and a detailed description thereof will be omitted.

The upper electric pattern 117 may be electrically connected to the bonding pad 115 or other electric component (e.g., a capacitor, a resistor, or an inductor) provided on the package substrate 100 to serve as a transmission path of electrical signals. The lower electric pattern 165 may be electrically connected to at least one of the bonding pads 115 through a conductive via 145 penetrating the core 101 to serve as a transmission path (e.g., a power or ground pattern) for transmitting electric signals (e.g., a power or ground signal). The lower electric pattern 165 may be used to perform a test operation on the semiconductor package 10. For example, an electric test tool (e.g., an electrical die sorting machine) may contact the lower electric pattern 165 to perform an electrical test on the semiconductor package 10.

Referring to FIGS. 2A and 2B, the semiconductor chip 200 and the bonding pads 115 may be connected to each other on the upper window region 110, and thus, the semiconductor chip 200 may be electrically connected to the package substrate 100. A size or position of the upper window region 110 may be variously changed depending of the arrangement of the bonding pads 115. As an example, in the case where the bonding pads 115 are arranged along the first direction D1 and at a center region of the package substrate 100, the upper window region 110 may be positioned at a center region of the top surface 100a of the package substrate 100. The upper window region 110 may have a rectangular shape elongated in the first direction D1. The upper window region 110 may occupy at least a portion of the top surface 100a of the package substrate 100. For example, the upper window region 110 may have an occupying area ranging from about 15% to about 20% relative to a total area of the top surface 100a of the package substrate 100. As such, where the upper window region 110 is at a center region of the package substrate 100, it may occupy a central 15% to 20% of the package substrate 100.

Figure 3A:
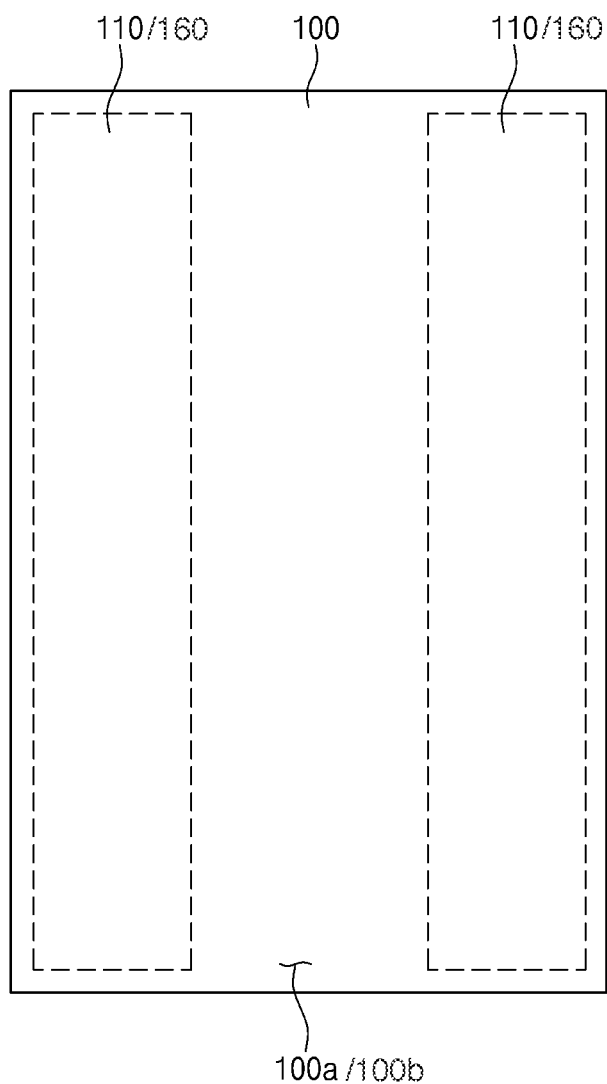
FIGS. 3A through 3E are plan views illustrating modified examples of FIG. 2B according to example embodiments.
Figure 3B:
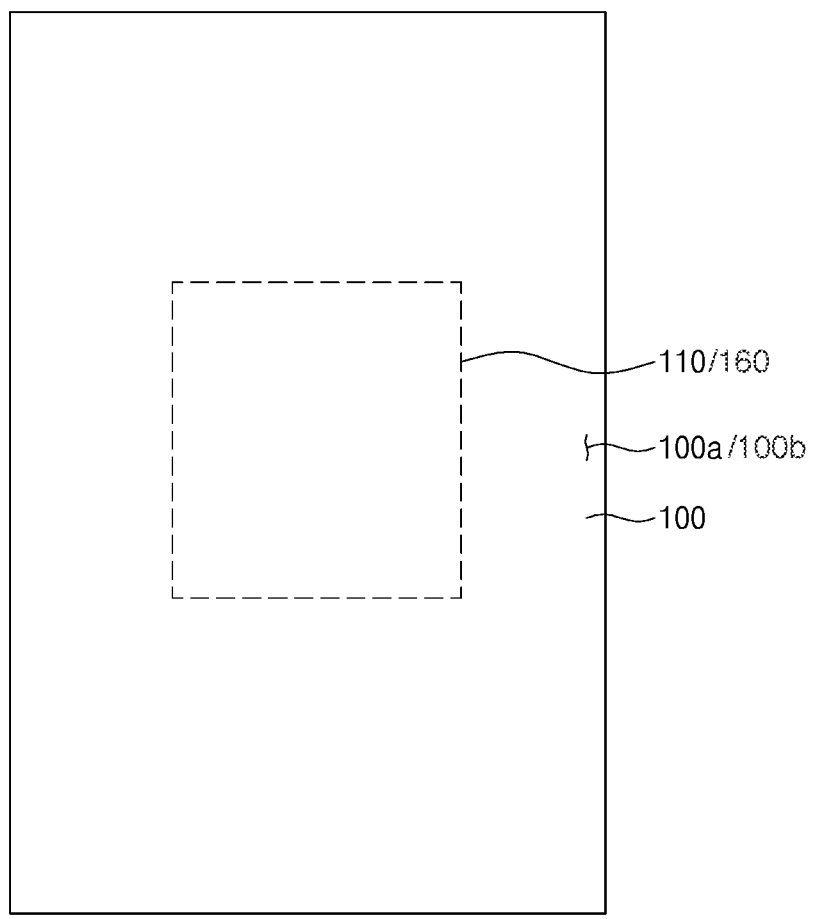
Figure 3C:
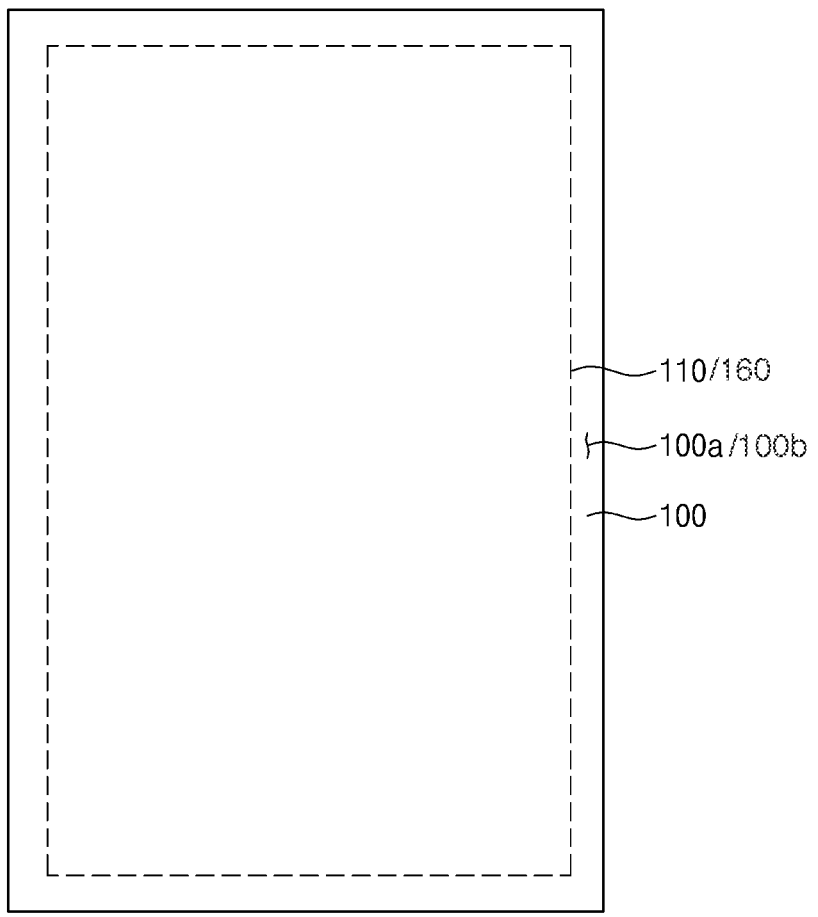
Figure 3D:
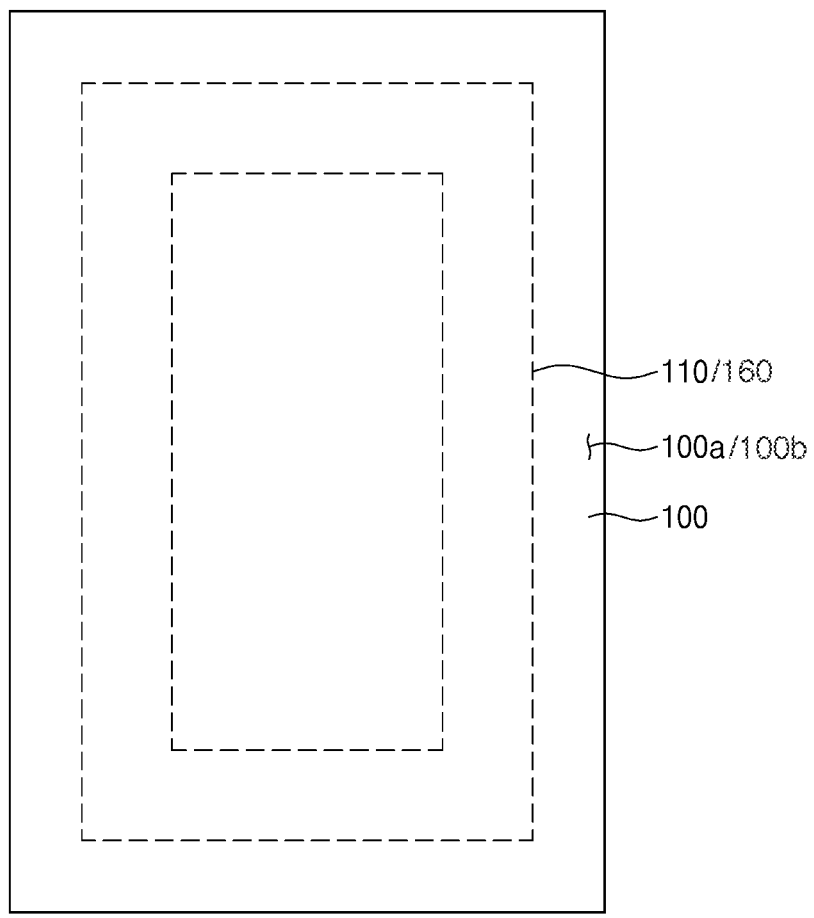
Figure 3E:
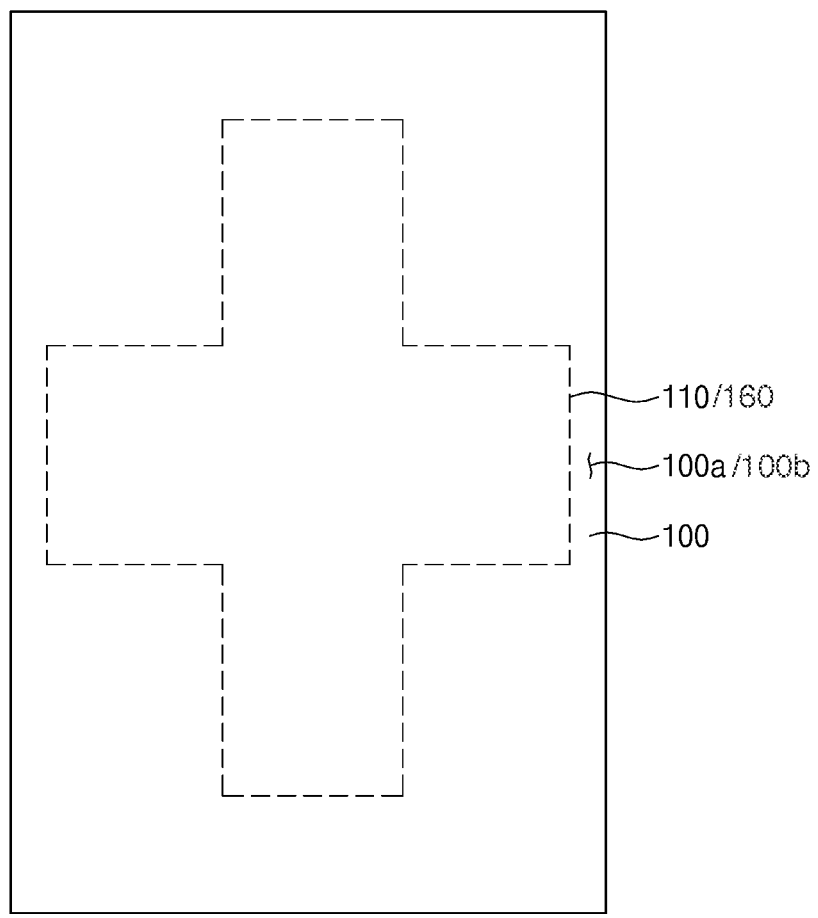

The size and shape of the upper window region 110 is not limited to those of the afore-described example and may be variously changed. As an example, a plurality of the upper window regions 110, each of which is shaped like a rectangle, may be provided at opposite edges of the top surface 100a of the package substrate 100, as shown in FIG. 3A. As another example, the upper window region 110 may be provided at a center region of the top surface 100a of the package substrate 100 to have a square or rectangular shape, as shown in FIG. 3B. As other example, the upper window region 110 may be provided to have the same shape, from a plan view as the top surface 100a of the package substrate 110, as shown in FIG. 3C, and almost the same size. Or the upper window region 110 may have the same size, from a plan view, as the top surface 100a of the package substrate 110. As still other example, the upper window region 110 may be provided to have a ring-like shape as shown in FIG. 3D or to have a cross-like shape as shown in FIG. 3E. In certain embodiments, the upper window region 110 is defined according to the placement of the bonding pads 115. For example, the upper window region 110 may have the same shape as the array or group of bonding pads 115 formed on a top surface 100a of the package substrate 110 (e.g., the shape corresponding to the outer boundary formed by the bonding pads 115). The upper window region 110 may include the total area occupied by the pattern formed by the corresponding bonding pads 115. The upper window region 110 may occupy a portion of the top surface 100a of the package substrate 100 and may include all of the bonding pads 115 at the top surface 110a of the package substrate 100 that connect to the semiconductor chip. The area of the upper window region 110 is different from the area occupied by the bonding pads 115 themselves.

Referring to FIGS. 2A and 2C, the lower window region 160 may overlap the upper window region 110. In the case where the upper window region 110 is provided at the center region of the top surface 100a of the package substrate 100, the lower window region 160 may be provided at a center region of the bottom surface 100b of the package substrate 100. As an example, in the case where the upper window region 110 occupies at least a portion of the top surface 100a of the package substrate 100, the lower window region 160 may occupy at least a portion of the bottom surface 100b of the package substrate 100. The lower window region 160 may have a rectangular shape elongated in the first direction D1, identical or similar to the upper window region 110. In certain embodiments, the lower window region 160 is defined according to the placement of the lower electric pattern 165. For example, the lower window region 160 may have the same shape as, and may be defined by, the outer boundaries of the lower electric pattern 165 formed on a bottom surface 100b of the package substrate 110. The lower window region 160 may include the total area occupied by the pattern formed by the corresponding lower electric pattern 165. Thus the area of the lower window region 160 is different from the area occupied by the lower electric pattern 165 itself.

The lower electric pattern 165 may be a pattern at a bottom of the package substrate 100, and may be, for example, below a bottom surface of a core 101 of the package substrate 100. In one embodiment, the lower electric pattern 165 does not contact any outer terminals 150 of the package substrate 100. Also, the lower electric pattern 165 may be located at a first vertical level of the package substrate 100. In certain embodiments, the lower electric pattern 165 does not contact any other terminals, pads, or ball lands at the first vertical level. Also, the lower electric pattern 165 may be defined to include all electrically connected conductive lines at the first vertical level that are electrically connected to a first bonding pad 115 by a conductive via included in the upper window region 160.

On the bottom surface 100b of the package substrate 100, a plurality of the ball land regions 180 may be provided spaced apart from each other with the lower window region 160 interposed therebetween. The lower window region 160 may occupy at least a portion of the bottom surface 100b of the package substrate 100; for example, an area of the lower window region 160 may range from about 15% to about 20%, relative to a total area of the bottom surface 100b. In some embodiments, the area of the lower window region 160 may correspond to the area of the upper window region 110 (for example, they may be the same). In one embodiment, the lower electric pattern 165 provided on the lower window region 160 may be provided in the form of a ladder extending in the first direction D1. Alternatively, the lower electric pattern 165 may be provided in the form of a mesh, as shown in FIG. 2D. However, the shape of the lower electric pattern 165 is not limited to the ladder or mesh and may be variously changed. For example, the shape may have at least one set of first lines extending in a first direction (e.g., D2 direction) and at least one set of second lines extending in a second direction (e.g., D1 direction). There may be more lines extending in one direction (e.g., D2 direction) than the other. In some embodiments, the lines of each set of lines are parallel to each other. In some embodiments, there are at least three lines (e.g., parallel lines) in each direction. The directions may be perpendicular to each other. The lower electric pattern 165 may have a plurality of straight lines that extend along a length direction of the package substrate 100 where the semiconductor chip 200 is mounted. In some embodiments, at least some of the straight lines may extend along the entire distance between two outermost ball lands 135 of the package substrate 100, and/or along the entire distance between two outermost bonding pads 115 of the package substrate 115.

As an example, the lower electric pattern 165 may be electrically connected to at least one of the ball lands 135 provided on one of the ball land regions 180. As another example, the lower electric pattern 165 may be electrically connected to at least one of the ball lands 135 provided on one of the ball land regions 180 and at least one of the ball lands 135 provided on another of the ball land regions 180. This may occur, for example, through internal conductive lines, or rerouting lines, (not shown) of the package substrate. Accordingly, in the case where, in order to operate the semiconductor chip 200, signals (e.g., a power signal, a ground signal, etc.) are applied to the outer terminal 150 and the ball land 135, the lower electric pattern 165 may allow for the signals to be transmitted to the connection terminal 250 through the bonding pad 115. As such, the bonding pad 115 may be connected to one or more circuit elements of the semiconductor chip 200, which circuit elements are for receiving ground or power signals.

As shown in FIGS. 3A through 3E, the lower window region 160 may be variously changed in position and shape. For example, the lower window region 160 may be provided at each of the opposite edges of the bottom surface 100b of the package substrate 100 to have a rectangular shape, as shown in FIG. 3A, or may be provided at the center region of the bottom surface 100b of the package substrate 100 to have a square or rectangular shape, as shown in FIG. 3B. Alternatively, as shown in FIG. 3C, the lower window region 160 may be provided to have the same or similar shape and size as the bottom surface 100b of the package substrate 100 and the ball lands 135 may be distributed in the lower window region 160. In some embodiments, the lower window region 160 may be provided to have a ring-like shape as shown in FIG. 3D or to have a cross-like shape as shown in FIG. 3E. In some embodiments, the upper window region 110 corresponds to a region where an array of bonding pads 115 and/or connection terminals 250 (e.g., balls or bumps) at the top surface of the package substrate 100 are formed, and the lower window region 160 corresponds to a region where an array of ball lands 135 and/or outer terminals 150 (e.g., balls or bumps) at the bottom surface of the package substrate 100 are not formed.

Unlike that illustrated in FIG. 2A, there is no requirement to form the lower window region 160 at a region overlapped with the upper window region 110. For example, as shown in FIG. 3A, the upper window region 110 may be provided at each of the opposite edges of the top surface 100a of the package substrate 100, and as shown in FIG. 2C, the lower window region 160 may be provided at the center region of the bottom surface 100b of the package substrate 100.

Referring to FIGS. 2A, 2B, and 2C, the semiconductor chip 200 may be mounted on the top surface 100a of the package substrate 100 to have solder material therebetween coinciding with an array of the bonding pads 115, and then, a reflow process may be performed to form the connection terminals 250. Due to heat energy for the reflow process, the bonding pads 115 and the lower electric pattern 165 may be expanded, and this may lead to warpage of the package substrate 100. In addition to the package substrate 100, the semiconductor chip 200 may also suffer from the warpage.

In the case where the semiconductor chip 200 and the package substrate 100 are bent in different directions, a space between the semiconductor chip 200 and the package substrate 100 may be increased, and thus, at least some of the connection terminals 250 may be electrically disconnected from at least one of the semiconductor chip 200 and the package substrate 100. However, according to certain embodiments, by optimizing an occupying area of the lower electric pattern 165 relative to the total area of the lower window region 160, it is possible to suppress or prevent the warpage of the package substrate 100 from occurring or to reduce or remove a difference in warpage direction between the package substrate 100 and the semiconductor chip 200.

In some embodiments, if an area occupied by the bonding pads 115 is given by a value of 100, the maximum area occupied by the lower electric pattern 165 may be given by a value of about 150. For example, the ratio of an area SB of the lower electric pattern 165 to an area SA of the bonding pads 115 (i.e., SB/SA) may be less than or equal to about 1.5. Using such a ratio can reduce the bending in the downward direction compared to an arrangement where a larger amount of metal is disposed at the bottom surface 100b of the package substrate 100. In some embodiments, the lower electric pattern 165 and the bonding pads 115 may be provided in such a way that the area ratio SB/SA therebetween ranges from about 0.5 to about 1.5 or from about 1 to about 1.4, but example embodiments of the inventive concept are not limited thereto. As an example, the lower electric pattern 165 may not be provided, as shown in FIG. 2E, and in this case, the area ratio SB/SA may be zero.

An occupying area of the bonding pads 115 (the cumulative area from a plan view from the plurality of bonding pads 115 themselves) may be about 30% of the area of the upper window region 110 (e.g., the area covered by the overall pattern formed by the plurality of bonding pads 115, that corresponds to the overall shape formed by the plurality of bonding pads 115), and an occupying area of the lower electric pattern 165 (the cumulative area from a plan view from the lower electric pattern 165 itself) may be about 45% of the area of the lower window region 180 (e.g., the area covered by the overall pattern formed by the lower electric pattern 165, that corresponds to the overall shape formed by the lower electric pattern 165. In such examples, the bonding pads 115 may be provided to occupy between 4.5% and 6% of the area of the top surface 100a of the package substrate 100, and the lower electric pattern 165 may be provided to occupy between 6.75% and 9% of the area of the bottom surface 100b of the package substrate 100. However, example embodiments of the inventive concept are not limited to the afore-described examples, and the areas of the bonding pads 115 and the lower electric pattern 165 may be variously changed depending on an occupying area of the connection terminals 250 relative to the total area of the semiconductor chip 200 or a size or area of the semiconductor package 10. For example, the occupying area of the bonding pads 115 may be higher than 30% of the area of the upper window region 110, and/or the occupying area of the lower electric pattern 165 may be lower than 45% of the area of the lower window region 180.

In some embodiments, the upper and lower window regions 110 and 160 may have the same area. In some embodiments, the lower electric pattern 165 may be a mesh-like structure, as shown in FIG. 2D, for example having a pitch of about 400 µm or larger.

In the case where the area SB of the lower electric pattern 165 is smaller (or even larger) than the area SA of the bonding pads 115, it is possible to realize good electric connection between the semiconductor chip 200 and the package substrate 100, if the area ratio of SB/SA is less than about 1.5, as will be described below.

Figure 4B:
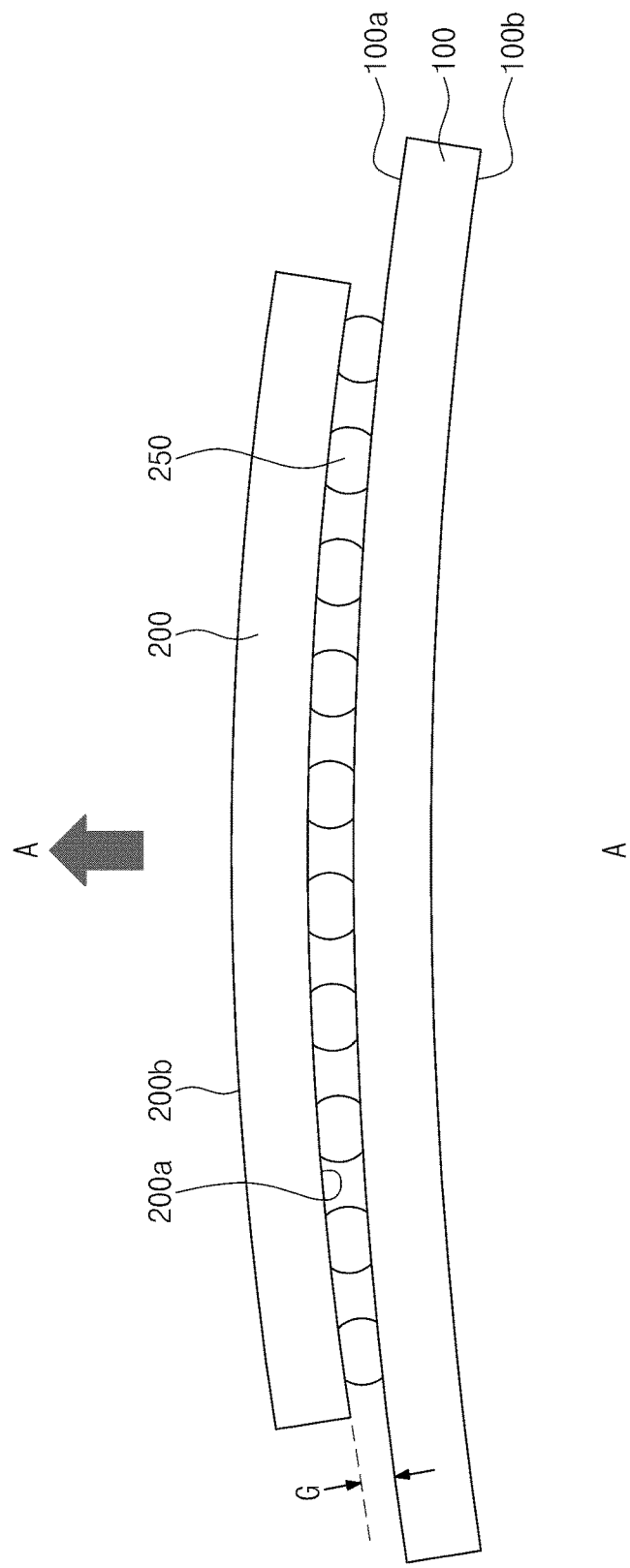
Figure 4C:
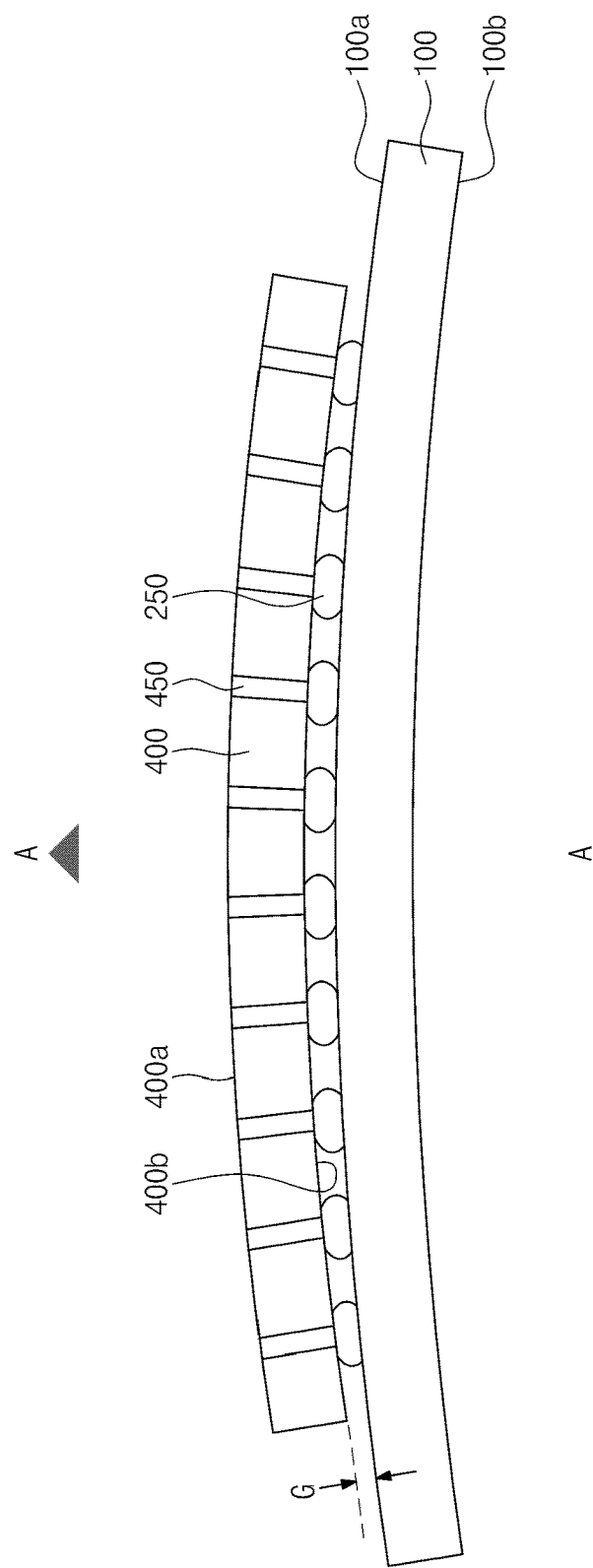

FIGS. 4A through 4C are sectional views illustrating examples of a warpage phenomenon, which may occur in a semiconductor package according to example embodiments of the inventive concept.

Referring to FIG. 4A, the semiconductor chip 200 may be mounted on the package substrate 100 to fabricate the semiconductor package 10 described with reference to FIG. 1, and a reflow process may be performed as a part of this process. Heat energy provided in the reflow process may lead to expansion or contraction of the semiconductor chip 200 and the package substrate 100 such that the issue of warpage may occur.

The warpage of the semiconductor chip 200 may be dominated by expansion or contraction of metal lines and insulating layers constituting an integrated circuit, in addition to other possible elements of the semiconductor chip 200. For example, in the case of one particular example of a semiconductor chip, such as the semiconductor chip 200, the first surface 200a provided with an integrated circuit may be more contracted than the second surface 200b, and this thermal contraction may result in the warpage of the semiconductor chip 200 occurring in an upward direction A from the first surface 200a toward the second surface 200b (e.g., so the first surface 200a facing the package substrate 100 has a concave shape and the second surface 200b opposite the first surface 200a has a convex shape). This may occur, for example in certain types of semiconductor chips that are designed to warp or bend in this direction upon heating.

In the case of the warpage of the package substrate 100, the top surface 100a may be affected by expansion or contraction of the bonding pads 115 of FIG. 2B, and the bottom surface 100b may be affected by expansion or contraction of the lower electric pattern 165 of FIG. 2C. As an example, in the case where the ratio in area of the lower electric pattern 165 to the bonding pads 115 (i.e., an area occupied by the pattern and pads, such as SB/SA) is approximately 1.5, the bottom surface 100b of the package substrate 100 may be more largely expanded than the top surface 100a or the top surface 100a of the package substrate 100 may be more largely contracted than the bottom surface 100b. Accordingly, the warpage of the package substrate 100 may occur in a downward direction B, contrary to the case of the semiconductor chip 200 (e.g., so the top surface 100a facing the semiconductor chip 200 has a concave shape and the bottom surface 100b opposite the first surface 100a has a convex shape).

If the ratio in area of the lower electric pattern 165 to the bonding pads 115 (i.e., SB/SA) is less than about 1.5, it is possible to suppress the warpage of the package substrate 100 that may occur in the downward direction B by the expansion of the lower electric pattern 165 (e.g., which may be more than the expansion of the material forming the package substrate core 101), and consequently, a size of a gap G between the semiconductor chip 200 and the package substrate 100 may be too small to cause a connection failure between the connection terminals 250. For example, if the ratio in area of the lower electric pattern 165 to the bonding pads 115 (i.e., SB/SA) is less than a particular predetermined amount, which may be 1.5 in one embodiment, it may be possible to properly connect the semiconductor chip 200 to the package substrate 100, even when the semiconductor chip 200 and the package substrate 100 are bent in different directions.

Since the semiconductor chip 200 is bent in the upward direction A and the package substrate 100 is bent in the downward direction B, the gap G between the semiconductor chip 200 and the package substrate 100 may have a smaller value at opposite edges of the package substrate 100 and a larger value at the center of the package substrate 100. In some embodiments, the length of the gap G may be changed within a range or below a threshold amount (e.g., about 20 μm) between the smallest gap G nearer to the edge of the semiconductor chip 200 and package substrate 100 and the largest gap G near the center of the semiconductor chip 200 and package substrate 100, allowing for the semiconductor chip 200 and the package substrate 100 to be properly connected to each other. A ratio in area of the lower electric pattern 165 to the bonding pads 115 (i.e., SB/SA) can be selected that limits an amount of warping of the package substrate 100 so that the difference between the biggest gap G (e.g., at an edge of the semiconductor chip 200) and the smallest gap (e.g., the gap G at a center of the semiconductor chip 200) is below the threshold amount (e.g., below 20 μm).

Referring to FIG. 4B, both of the package substrate 100 and the semiconductor chip 200 may be bent in the upward direction A. For example, in the case where the lower electric pattern 165 has an area smaller than the bonding pads 115 (e.g., where a core 101 is formed of a material with a smaller CTE than the lower electric pattern 165 and bonding pads 115), the warpage of the package substrate 100 and the semiconductor chip 200 may occur in the same direction, even further reducing the gap G. In this case, the value of the gap G may vary even less between ends of the semiconductor chip 200 and a middle of the semiconductor chip 200, or may not change. As an example, in the case where the lower electric pattern 165 has an area smaller than the bonding pads 115 by a certain amount, the package substrate 100 may be bent in the upward direction A. Thus, to compensate, the package substrate 100 may include a lower electric pattern 165 that has a smaller area, such that a ratio in area of the lower electric pattern 165 to the bonding pads 115 (i.e., SB/SA) is lower than 1 (e.g., 0.5). A ratio can be selected that permits the warping of the package substrate 100 to match the warping of the semiconductor chip 400.

Referring to FIG. 4C, a semiconductor chip 400 with a plurality of through electrodes 450 may be mounted on the package substrate 100. The semiconductor chip 400 may be mounted on the package substrate 100 in such a way that a first surface 400a thereof is oriented in an upward direction and a second surface 400b thereof is oriented in a downward direction. The connection terminals 250 may be provided between the second surface 400b of the semiconductor chip 400 and the top surface 100a of the package substrate 100 and may be respectively coupled to the through electrodes 450. The first surface 400a may be used as the active surface, and the second surface 400b may be used as the inactive surface. In some embodiments, the first surface 400a may be used as the inactive surface, and the second surface 400b may be used as the active surface (e.g., if multiple chips having TSVs are stacked on the substrate with their active surfaces facing the package substrate 100).

In the example shown in FIG. 4C, due to the construction of the semiconductor chip 400, the semiconductor chip 400 may be bent in the upward direction A from the second surface 400b toward the first surface 400a upon heating (e.g., so that a top surface 400a has a convex shape and the bottom surface 400b has a concave shape). The package substrate 100 may be bent in the upward direction A, like the semiconductor chip 400. In this case, a volume of the gap G between the semiconductor chip 400 and the package substrate 100 may again vary even less between ends of the semiconductor chip 200 and a middle of the semiconductor chip 200, or may not change. Alternatively, the package substrate 100 may be bent in the downward direction B as shown in FIG. 4A, and the volume of the gap G may be changed within a range, allowing for the semiconductor chip 400 and the package substrate 100 to be properly connected to each other.

Figure 5A:
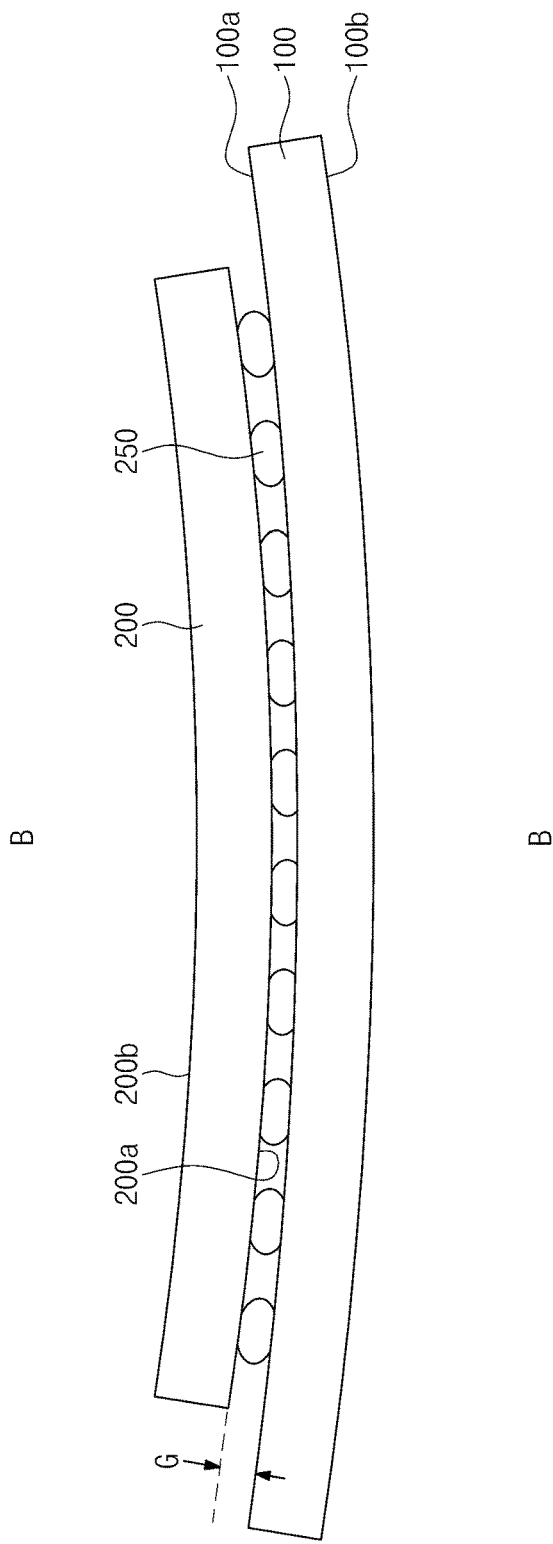
FIG. 5A is a sectional view exemplarily illustrating a warpage phenomenon, which may occur in a semiconductor package according to other example embodiments of the inventive concept.
Figure 5B:
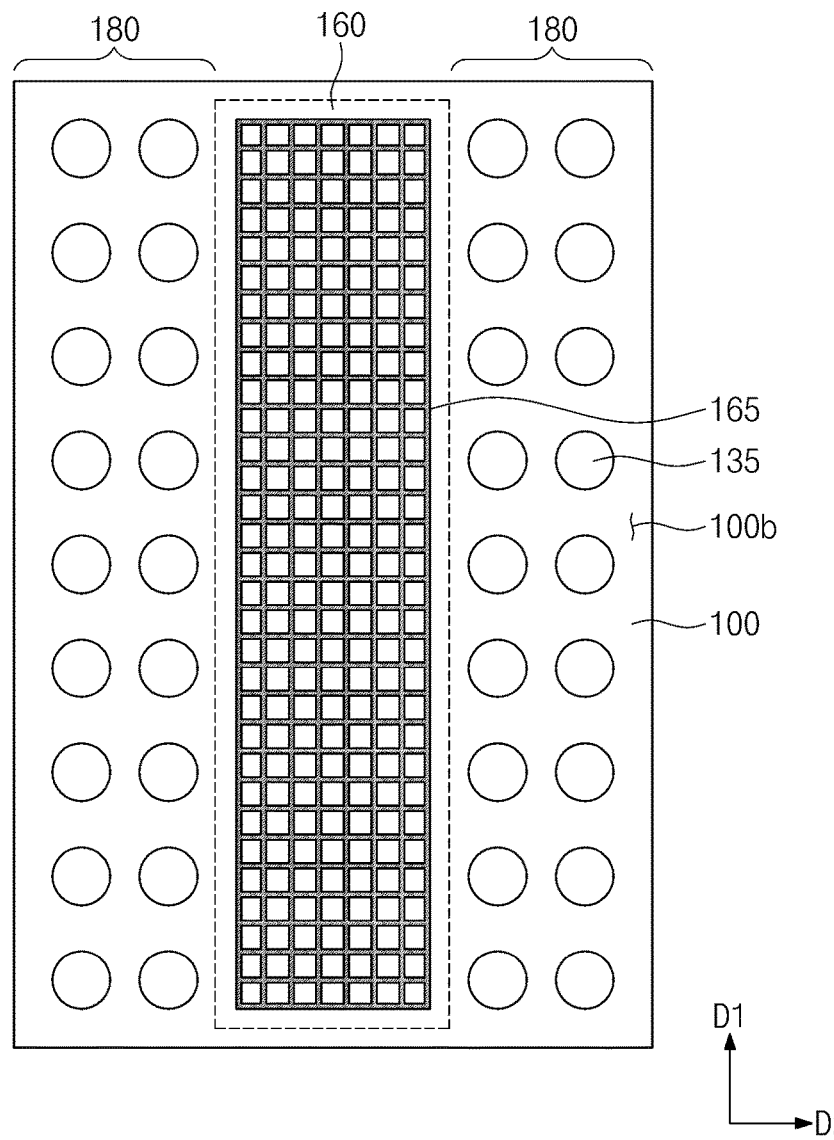
FIG. 5B is a plan view illustrating a bottom surface of a package substrate of the semiconductor package of FIG. 5A according to example embodiments.

FIG. 5A is a sectional view exemplarily illustrating a warpage phenomenon, which may occur in a semiconductor package according to other example embodiments of the inventive concept. FIG. 5B is a plan view illustrating a bottom surface of a package substrate of the semiconductor package of FIG. 5A. FIG. 5C is a sectional view illustrating a modified example of FIG. 5A.

Referring to FIG. 5A, when a reflow process is performed, the semiconductor chip 200 may be bent in the downward direction B from the second surface 200b toward the first surface 200a. This may occur for different types of semiconductor chips 200 configured to bend in this direction when heated during reflow. In some embodiments, the package substrate 100 may be configured to be bent more in the same direction (i.e., the downward direction B) as the warpage direction of the semiconductor chip 200. As an example, the lower electric pattern 165 provided on the bottom surface 100b of the package substrate 100 may be provided to have a denser mesh-like structure, whose pitch is about 400 μm or less (e.g., 300 μm or 250 μm), as shown in FIG. 5B. The top surface 100a of the package substrate 100 may have the same or similar structure as that illustrated in FIG. 2B. The first surface 200a may be used as the active surface, and the second surface 200b may be used as the inactive surface. In some embodiments, the first surface 200a may be used as the inactive surface, and the second surface 200b may be used as the active surface.

In the embodiment of FIGS. 5A and 5B, a ratio of an area SB of the lower electric pattern 165 to an area SA of the bonding pads 115 (i.e., SB/SA) may be greater than about 1.5. If the area ratio of SB/SA is at least about 1.5, the package substrate 100 may be bent in the same direction (i.e., the downward direction B) as the warpage direction of the semiconductor chip 200, and to match the same amount of bending. Accordingly, the value difference of the gap G at different locations may be only slight or not changed at all (for example, it may be only +/−1%, or otherwise substantially the same distance so that it is substantially uniform between the semiconductor chip 200 and the package substrate 100), and it is possible to realize proper electric connection between the semiconductor chip 200 and the package substrate 100.

Referring to FIG. 5C, the semiconductor chip 400 with the penetration electrodes 450 may be mounted on the package substrate 100. The semiconductor chip 400 may be bent in the downward direction B from the first surface 400a toward the second surface 400b. The first surface 400a may be used as the active surface, and the second surface 400b may be used as the inactive surface. In some embodiments, the first surface 400a may be used as the inactive surface, and the second surface 400b may be used as the active surface.

The top surface 100a of the package substrate 100 may have the same or similar structure as that illustrated in FIG. 2B, and the bottom surface 100b may have the same or similar structure as that illustrated in FIG. 5B. In this case, the package substrate 100 may be bent in the downward direction B, like the semiconductor chip 400. In certain embodiments, even if there is a gap difference at and end of the semiconductor chip 400 compared to a center of the semiconductor chip 400, the value of the gap G difference may be below a threshold, allowing for the semiconductor chip 400 and the package substrate 100 to be properly connected to each other.

As described above, by controlling an area occupied by an electric pattern (e.g., a conductive mesh pattern) on a bottom of a package substrate, the amount of warpage or bending of the package substrate can be controlled. In certain embodiments where there is a warpage difference during heating between a package substrate and a semiconductor chip mounted thereon, the warpage difference can result in different sized gaps between the two components at different locations. For example, a gap between a top surface of the package substrate and a bottom surface of the semiconductor chip at a center of the semiconductor chip may be larger than a gap between the top surface of the package substrate and the bottom surface of the semiconductor chip at an edge of the semiconductor chip, or vice versa. This may result in a gap difference between the largest gap between the two components and a smallest gap between the two components. In this case, an occupied area of the electric pattern can be controlled to reduce the gap difference to be below a desired threshold amount.

For example, two semiconductor chips may be used that have the same size and shape in a plan view and a same number and location of connection terminals for connecting to a package substrate. However, the semiconductor chips may have different construction that causes different amounts of bending when heated during a reflow process. Similarly if identical chips are used, in some situations, a first group of chips may be stacked to form a first package, but a single chip or a second group of chips having a different number of chips from the first group may be stacked to form a second package. Because the first group of chips has a different size from the single chip or second group of chips, a different amount of bending may occur during a reflow of the two different devices.

In any of the above situations, two different package substrates may be used. Each package substrate may have the same layout of ball lands for connecting to the various different semiconductor chips or stacks of semiconductor chips. However, the different package substrates may have a different configuration of an electric pattern formed at a bottom of the package substrate to control the bending during reflow in different ways, for example as described in the various examples above. The configuration may be selected to result in a desired ratio of occupied area of the electric pattern to occupied area of a group of conductive pads formed at the top of the package substrate. During manufacturing of a package substrate, different configurations for the electric pattern may be selected to result in different amounts of bending, based on the semiconductor chip or chips to be mounted on the package substrate. The different configurations may be selected, for example, from among the examples discussed above in connection with the various figures.

As a specific example, during manufacturing, a manufacturing machine and/or operator may determine and select what type of chip or chip stack is to be mounted on a package substrate. An amount and direction of bending expected during reflow may be associated with the type. As a result, based on the expected amount and direction of bending, when manufacturing the package substrate, a configuration for the lower electric pattern such as described above may be selected (e.g., by controlling a mask or mask pattern) that will result in an amount of bending of the package substrate during reflow such that all electrical connections between the package substrate and the semiconductor chip or chip stack are connected properly during reflow (e.g., so a continuous connection without a break is formed). Ratios and amounts such as described above may be used, and may be determined based on the amount and direction of bending of the semiconductor chip, and the expected effect that the ratio and amount will have. In some embodiments, other than the different lower electric pattern, the remainder of the package substrate may have the same configuration and structure for different manufactured package substrates.

Figure 6A:
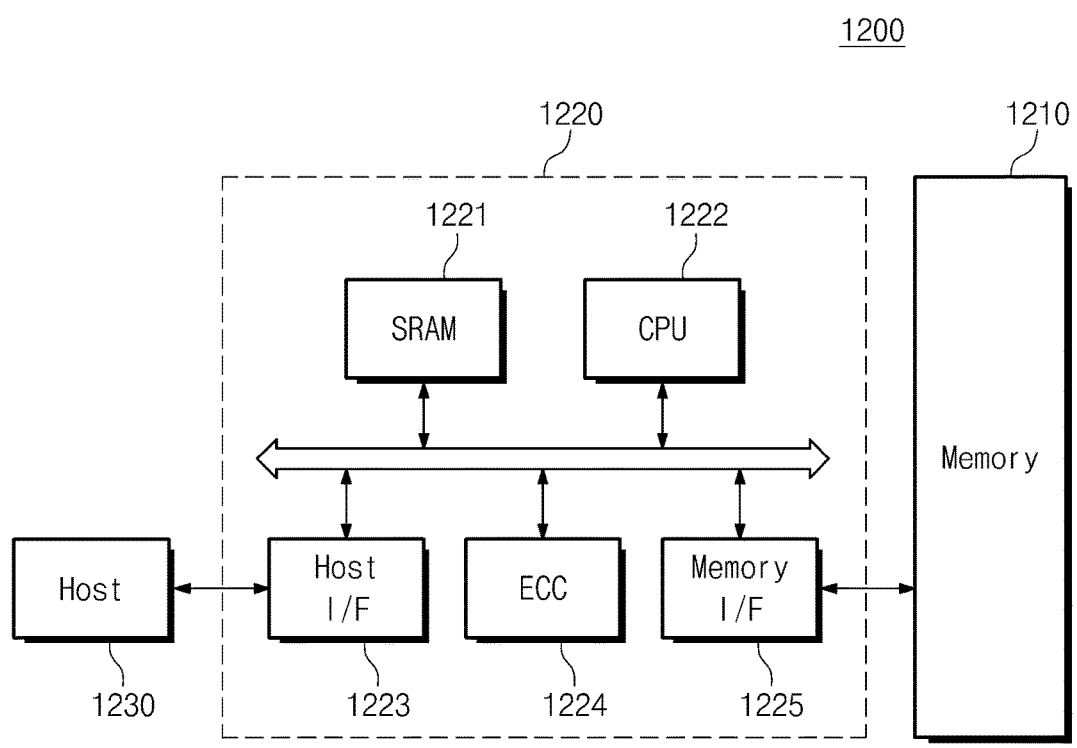
FIG. 6A is a block diagram illustrating a memory system including a semiconductor package according to example embodiments of the inventive concept.
Figure 6B:
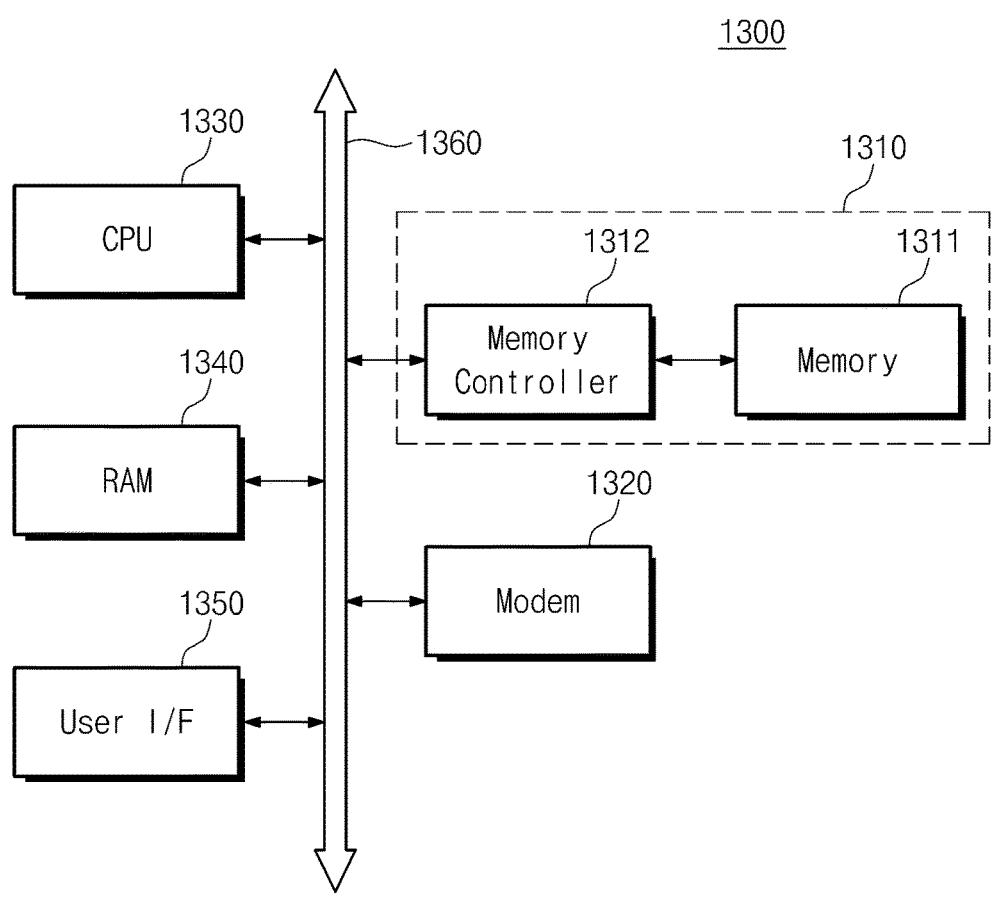
FIG. 6B is a block diagram illustrating an information processing system including a semiconductor package according to example embodiments of the inventive concept.

FIG. 6A is a block diagram illustrating a memory system including a semiconductor package according to example embodiments of the inventive concept. FIG. 6B is a block diagram illustrating an information processing system including a semiconductor package according to example embodiments of the inventive concept.

Referring to FIG. 6A, a memory system 1200 may be provided in the form of a memory card or a solid state drive (SSD). The memory system 1200 may include a memory device 1210, a host 1230, a memory controller 1220 controlling general data exchange between the host 1230 and the memory device 1210. The memory controller 1220 may include a static random access memory (SRAM) 1221, a processing unit 1222, a host interface 1223, an error correction block 1224, and a memory interface 1225. The SRAM 1221 may be used as an operating memory of the processing unit 1222. The host interface 1223 may be configured to have a data exchange protocol of the host 1230 connected to the memory system 1200, and the error correction block 1224 may detect and correct errors included in data read from the memory device 1210. The memory interface 1225 may be configured to interface with the memory device 1210. The processing unit 1222 may be configured to perform general control operations for data exchange of the memory controller 1220. At least one of the memory device 1210, the SRAM 1221, or the central processing unit 1222 may include at least one of the semiconductor packages according to example embodiments of the inventive concept.

Referring to FIG. 6B, an information processing system 1300 may be a mobile device and/or a desktop computer. In some embodiments, the information processing system 1300 may include a memory system 1310, a modem 1320, a central processing unit (CPU) 1330, a RAM 1340, and a user interface 1350, which are electrically connected to a system bus 1360. The memory system 1310 may include a memory device 1311 and a memory controller 1312 and may be configured to have the same features as the memory system 1200 of FIG. 6A. Data processed by the CPU 1330 and/or input from the outside may be stored in the memory system 1310. In certain embodiments, the information processing system 1300 may be provided in the form of a memory card, a solid state drive (SSD), a camera image sensor, or an application chipset.

According to example embodiments of the inventive concept, it is possible to suppress warpage from occurring in a circuit board such as a package substrate or to reduce a difference in warpage direction between a circuit board and a semiconductor chip. This makes it possible to properly form electric connection paths between the semiconductor chip and the circuit board and consequently to improve electric reliability of a semiconductor package. Warpage of the circuit board can be controlled in some examples by controlling a configuration of an electric pattern on a bottom of the circuit board.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package substrate, comprising:
   an upper conductive pattern disposed on a top surface of the semiconductor package substrate, the upper conductive pattern including bonding pads and upper electric patterns; and
   a lower conductive pattern disposed on a bottom surface of the semiconductor package substrate, the lower conductive pattern including ball lands and a lower electric pattern,
   wherein the bonding pads are disposed in an upper window region of the top surface and at least one of the bonding pads is electrically connected to at least one of the upper electric patterns, and the lower electric pattern is disposed in a lower window region and is electrically connected to at least one of the bonding pads and at least one of the ball lands,
   wherein the lower window region is defined by outer boundaries of the lower electric pattern along at least two perpendicular directions, and the upper window region is defined as an overlapped region with the lower window region, and
   wherein the upper electric patterns and the lower electric pattern include the same metallic material, and a ratio of the area occupied by the lower electric pattern in the lower window region to the area occupied by the upper conductive pattern in the upper window region is less than or equal to 1.5.

2. The semiconductor package substrate of claim 1, wherein a first area occupied by the upper window region is equal to a second area occupied by the lower window region.

3. The semiconductor package substrate of claim 2, wherein the first area occupied by the upper window region is 15% to 20% of a total area of the top surface of the package substrate.

4. The semiconductor package substrate of claim 3, wherein the bonding pads occupy 4.5% to 6% of the total area of the top surface of the package substrate.

5. The semiconductor package substrate of claim 3, wherein the lower electric pattern occupies 6.75% to 9% of a total area of the bottom surface of the package substrate.

6. The semiconductor package substrate of claim 1, further including a core between the upper conductive pattern and the lower conductive pattern.

7. The semiconductor package substrate of claim 6, wherein both the upper conductive patter and the lower conductive pattern have higher coefficients of thermal expansion (CTE) than that of the core.

8. The semiconductor package substrate of claim 1, wherein the lower electric pattern has a ladder shape or a mesh structure.

9. A semiconductor package, comprising:
   a package substrate having a top surface and a bottom surface;
   an upper conductive pattern disposed on the top surface of the package substrate, the upper conductive pattern including bonding pads and upper electric patterns;
   a lower conductive pattern disposed on the bottom surface of the package substrate, the lower conductive pattern including ball lands and a lower electric pattern;
   a first semiconductor chip mounted on the top surface of the package substrate;
   a plurality of connection terminals connecting the bonding pads and the first semiconductor chip; and
   a plurality of outer terminals connected to the ball lands,
   wherein the bonding pads are disposed in an upper window region of the top surface and at least one of the bonding pads is electrically connected to at least one of the upper electric patterns, and the lower electric pattern is disposed in a lower window region and is electrically connected to at least one of the bonding pads and at least one of the ball lands,
   wherein the lower window region is defined by outer boundaries of the lower electric pattern along at least two perpendicular directions, and the upper window region is defined as an overlapped region with the lower window region, and
   wherein the upper electric patterns and the lower electric pattern include the same metallic material, and a ratio of the area occupied by the lower electric pattern in the lower window region to the area occupied by the upper conductive pattern in the upper window region is less than or equal to 1.5.

10. The semiconductor package of claim 9, wherein the upper window region and the lower window region are disposed in a middle region of the top surface and the bottom surface of the package substrate respectively.

11. The semiconductor package of claim 9, wherein the lower electric pattern includes a power or ground pattern electrically connected to at least one of the plurality of bonding pads and electrically connected to one or more circuit elements of the first semiconductor chip for providing power or ground signals.

12. The semiconductor package of claim 9, wherein the first semiconductor chip is mounted on the top surface of the package substrate in a flip-chip bonding manner in which the plurality of connection terminals electrically connects the package substrate and the first semiconductor chip.

13. The semiconductor package of claim 12, wherein the first semiconductor chip includes a plurality of through silicon vias (TSVs).

14. The semiconductor package of claim 13, further including a second semiconductor chip stacked on the first semiconductor chip, an active surface of the second semiconductor chip facing the package substrate and electrically connected to the package substrate by the TSVs.

15. The semiconductor package of claim 12, further including an under-fill layer, the under-fill layer filling a space formed between the first semiconductor chip and the package substrate.

16. The semiconductor package of claim 12, wherein multiple chips are stacked on the first semiconductor chip, and each of the multiple chips is electrically connected to the package substrate by through silicon vias (TSVs).

17. The semiconductor package of claim 16, wherein the first semiconductor chip is a processing unit and the multiple chips are memory devices.

18. The semiconductor package of claim 9, wherein an inactive surface of the first semiconductor chip faces the package substrate.

19. The semiconductor package of claim 18, wherein the first semiconductor chip includes through silicon vias (TSVs) which electrically connect an active surface of the first semiconductor chip to the package substrate.

20. The semiconductor package of claim 19, further including a second semiconductor chip stacked on the first semiconductor chip, and the second semiconductor chip is electrically connected with the TSVs in a flip-chip bonding manner.

* * * * *